United States Patent
Chun et al.

(10) Patent No.: US 9,269,420 B2
(45) Date of Patent: Feb. 23, 2016

(54) SEMICONDUCTOR MEMORY DEVICE AND SENSE AMPLIFIER CONTROL METHOD THEREOF

(71) Applicant: SAMSUNG ELECTRONICS CO., LTD., Gyeonggi-do (KR)

(72) Inventors: Kichul Chun, Gyeonggi-do (KR); Hyun-Chul Yoon, Gyeonggi-do (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/253,353

(22) Filed: Apr. 15, 2014

(65) Prior Publication Data

US 2015/0003146 A1  Jan. 1, 2015

(30) Foreign Application Priority Data

Jun. 27, 2013 (KR) .................. 10-2013-0074569

(51) Int. Cl.
| | | |
|---|---|---|
| G11C 11/24 | (2006.01) | |
| G11C 11/4094 | (2006.01) | |
| G11C 11/404 | (2006.01) | |
| G11C 11/405 | (2006.01) | |
| G11C 11/4091 | (2006.01) | |
| G11C 11/4074 | (2006.01) | |

(52) U.S. Cl.
CPC .......... *G11C 11/4094* (2013.01); *G11C 11/404* (2013.01); *G11C 11/405* (2013.01); *G11C 11/4091* (2013.01); *G11C 11/4074* (2013.01)

(58) Field of Classification Search
CPC ............... G11C 11/404; G11C 11/405; G11C 11/4074; G11C 11/4091

USPC .............................. 365/149, 189.09, 205, 207
See application file for complete search history.

(56) References Cited

U.S. PATENT DOCUMENTS

| | | | |
|---|---|---|---|
| 6,198,677 B1 | 3/2001 | Hsu et al. | |
| 6,205,068 B1 * | 3/2001 | Yoon ............................ | 365/203 |
| 6,219,294 B1 * | 4/2001 | Huber et al. .................. | 365/226 |
| 6,314,028 B1 | 11/2001 | Kono | |
| 6,600,688 B2 * | 7/2003 | Kawabata ..................... | 365/205 |
| 6,735,134 B2 | 5/2004 | Park | |
| 7,616,513 B1 * | 11/2009 | Peng et al. .................... | 365/207 |
| 8,068,369 B2 * | 11/2011 | Kajigaya .................. | 365/185.21 |

FOREIGN PATENT DOCUMENTS

| | | |
|---|---|---|
| JP | 11086549 | 3/1999 |
| JP | 11087649 | 3/1999 |
| JP | 2002025266 | 1/2002 |
| KR | 1020060005626 | 1/2006 |
| KR | 1020060012216 | 2/2006 |
| KR | 1020060135232 | 12/2006 |

* cited by examiner

*Primary Examiner* — Pho M Luu
(74) *Attorney, Agent, or Firm* — F. Chau & Associates, LLC

(57) ABSTRACT

A semiconductor memory device is provided. A cell array includes a DRAM cell connected to one of a pair of bit lines. A bit line sense amplifier is coupled to the pair of bit lines. The bit line sense amplifier discharges a low-level bit line of the pair of bit lines toward a ground level and clamps the low-level bit line to a boosted sense ground voltage in response to a control signal. A sense amplifier control logic generates the control signal having a pulse interval. The low-level bit line is discharged toward the ground level for the pulse interval and after the pulse interval ends, the low-level bit line is clamped to the boosted sense ground voltage.

20 Claims, 10 Drawing Sheets

SEMICONDUCTOR MEMORY DEVICE AND SENSE AMPLIFIER CONTROL METHOD THEREOF

CROSS-REFERENCE TO RELATED APPLICATION

This application claims priority under 35 U.S.C. §119 to Korean Patent Application No. 10-2013-0074569, filed Jun. 27, 2013 in the Korean Intellectual Property Office, the disclosure of which is incorporated herein by reference in its entirety.

TECHNICAL FIELD

The present inventive concept relates to a semiconductor memory device and a control method thereof.

DISCUSSION OF RELATED ART

Dynamic Random Memory (DRAM) devices may use a Boosted Sense Ground (Hereinafter, referred to as 'BSG') technique to increase refresh characteristics and write speeds. In a sensing operation of DRAM devices, one of a pair of bit lines is discharged to a low level (e.g., Vss or 0 volt) and the other is charged to a high level (e.g., Vdd or Vcc). A bit line discharged to a low level may be referred to as a low-level bit line. The other bit line charged to a high level may be referred to as a high-level bit line. With the BSG technique, the low level is controlled to be a BSG level that is slightly higher than a ground level Vss. If the low-level bit line is maintained to have a BSG level during an access of DRAM cells, refresh characteristics of unselected memory cells are increased. Since unselected memory cells have low GIDL (Gate Induced Drain Leakage), static refresh characteristic is also increased.

SUMMARY

According to an exemplary embodiment of the inventive concept, a semiconductor memory device is provided. A cell array includes a DRAM cell connected to one of a pair of bit lines. A bit line sense amplifier is coupled to the pair of bit lines. The bit line sense amplifier discharges a low-level bit line of the pair of bit lines toward a ground level and clamps the low-level bit line to a boosted sense ground voltage in response to a control signal. A sense amplifier control logic generates the control signal having a pulse interval. The low-level bit line is discharged toward the ground level for the pulse interval and after the pulse interval ends, the low-level bit line is clamped to the boosted sense ground voltage.

According to an exemplary embodiment of the inventive concept, a method of operating a semiconductor memory device is provided. One of a pair of bit lines and one of a pair of bit line replicas are discharged to a ground level in response to a command. A voltage of the one of the pair of bit line replicas is compared with a boosted sense ground voltage. The discharging of the one of the pair of bit lines is terminated when the voltage of the one of the pair of bit line replicas is substantially equal to or is lower than the boosted sense ground voltage.

According to an exemplary embodiment of the inventive concept, a semiconductor memory device is provided. The semiconductor memory device includes a pair of bit lines, a pair of input/output data lines, and a bit line sense amplifier. The pair of bit lines includes a first bit line and a second bit line. The bit line sense amplifier discharges, in response to a first control signal, the first bit line toward a low level for a first time interval and maintains, in response to a second control signal, a boosted sense ground voltage for a second time interval. The first bit line maintained at the boosted sense ground voltage is coupled to at least one of the pair of input/output data lines in response to a column select signal.

BRIEF DESCRIPTION OF THE DRAWINGS

These and other features of the inventive concept will become more apparent by describing in detail exemplary embodiments thereof with reference to the accompanying drawings of which.

DETAILED DESCRIPTION OF THE EXEMPLARY EMBODIMENTS

Figure 1:
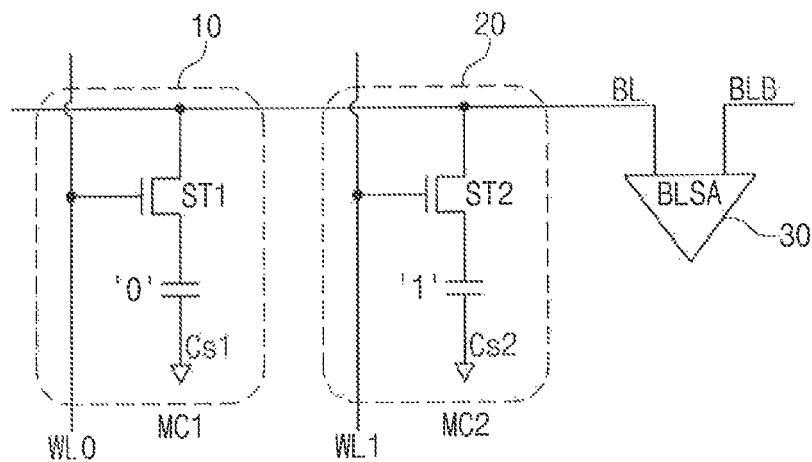
FIG. 1 is a circuit diagram illustrating a boosted sense ground scheme according to an exemplary embodiment of the inventive concept.

Exemplary embodiments of the inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

Hereinafter, a synchronous DRAM is used as an example of a semiconductor device to describe the inventive concept.

FIG. 1 is a circuit diagram for illustrating a boosted sense ground scheme according to an exemplary embodiment of the inventive concept. Referring to FIG. 1, a semiconductor memory device of the inventive concept includes memory cells 10 and 20 and a bit line sense amplifier 30.

The memory cells 10 and 20 are connected to the same bit line BL. The memory cell 10 is connected to a word line WL0 and the memory cell 20 is connected to a word line WL1. The memory cell 10 includes an access transistor ST1 and a cell capacitor Cs1. A gate of the access transistor ST1 is connected to the word line WL0, and one end thereof is connected to the bit line BL. The memory cell 20 includes an access transistor ST2 and a cell capacitor Cs2. A gate of the access transistor ST2 is connected to the word line WL1, and one end thereof is connected to the bit line BL.

Although not shown, the sense amplifier 30 may include an N-type sense amplifier NSA to discharge a low-level bit line of bit lines BL and BLB and a P-type sense amplifier PSA to charge a high-voltage bit line of the bit lines BL and BLB. The N-type sense amplifier NSA sets the low-level bit line to a boosted sense ground (BSG) level Vbsg higher than a ground voltage Vss. Through sensing of the boosted sense ground scheme, it is possible to reduce a charge leakage generated at the memory cell 20 that is connected to an unselected word line WL1 and stores logic state "1" when the memory cell Cs1 having logic state "0" is selected. In this case, the bit line BL becomes the low-level bit line set to the BSG level in an sensing operation of the memory cell Cs1.

Figure 2:
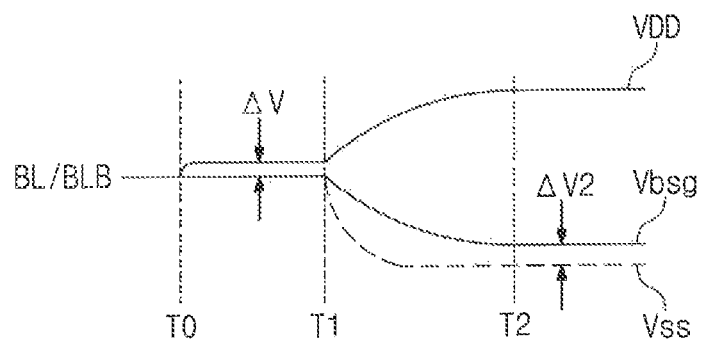
FIG. 2 is a waveform diagram illustrating a sensing operation using a bit line sense amplifier BLSA of FIG. 1 according to an exemplary embodiment of the inventive concept.

FIG. 2 is a waveform diagram illustrating a sensing operation using a bit line sense amplifier BLSA of FIG. 1 according to an exemplary embodiment of the inventive concept. Referring to FIG. 2, a bit line voltage maintains a BSG level Vbsg.

If the bit line sense amplifier 30 is activated to access the memory cell Cs2, bit lines BL and BLB are pre-charged with a pre-charge voltage VDD/2 through a pre-charge operation. The pre-charge voltage VDD/2 may be an arithmetic average of the high level (e.g., VDD) and the ground level. If a word line WL1 is selected at T0 (i.e., an access transistor ST2 is turned on), a potential difference ΔV1 between the bit line BL and the complementary bit line BLB is developed due to charge sharing between the cell capacitor Cs2 and the bit line BL. After the charge sharing, the voltage of the bit line BL is higher than the pre-charge voltage VDD/2 while the complementary bit line BLB maintains the pre-charge voltage VDD/2 for a predetermined time. The cell capacitor Cs2 stores charges corresponding to logic state "1".

At T1, N-type and P-type sense amplifiers NSA and PSA in the bit line sense amplifier 30 are activated. In this case, the bit line BL is charged to the high level (e.g., a power supply voltage VDD level), and the complementary bit line BLB is discharged to a boosted sense ground voltage Vbsg level. In this case, the low level bit line corresponds to the complementary bit line BLB. The BSG level Vbsg is higher by ΔV2 than the ground level Vss. In this case, charge leakage of memory cells having logic state "1" connected to the low-level bit line is reduced.

Figure 3:
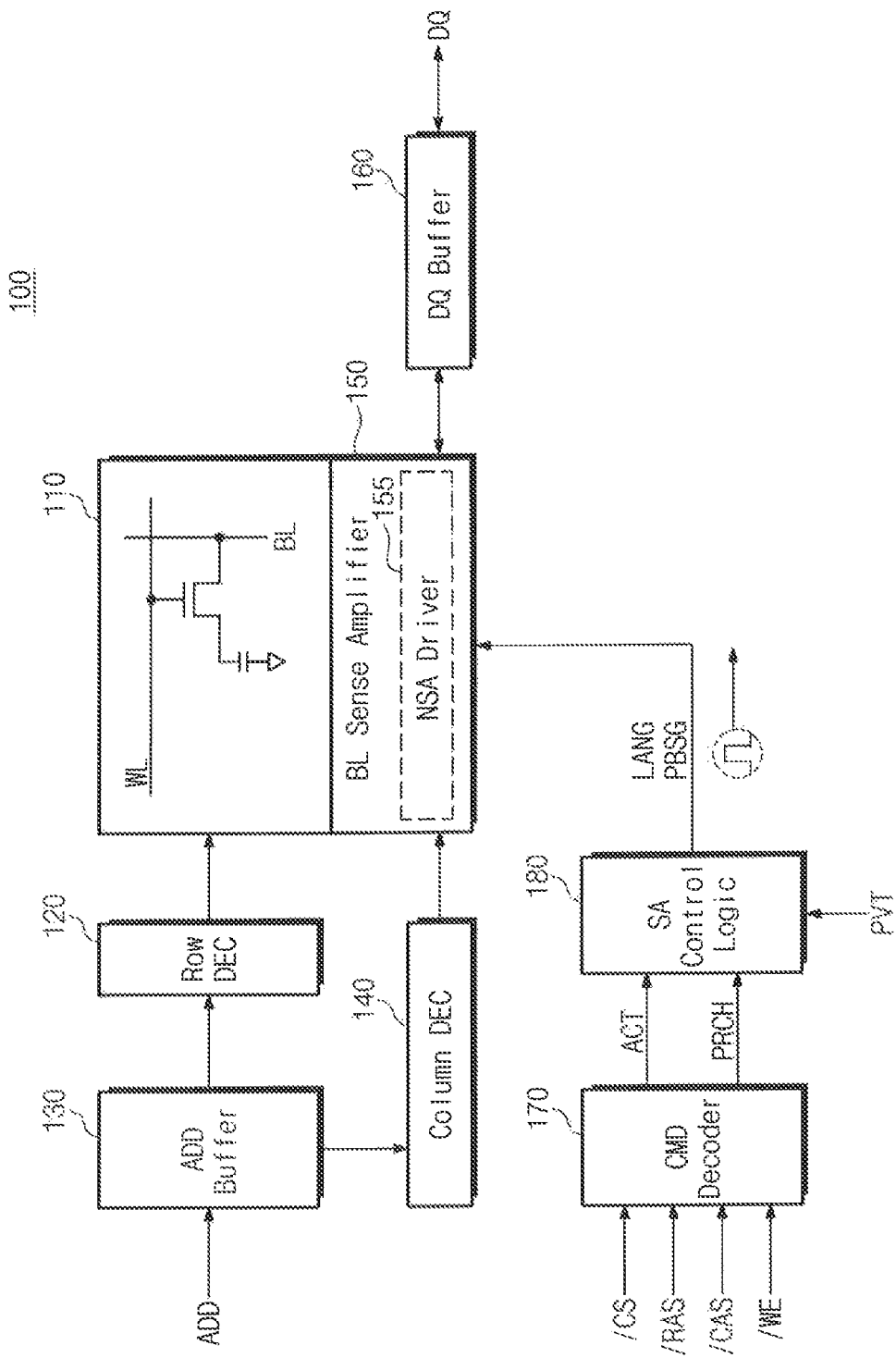
FIG. 3 is a block diagram illustrating a semiconductor memory device according to an exemplary embodiment of the inventive concept.

FIG. 3 is a block diagram illustrating a semiconductor memory device according to an exemplary embodiment of the inventive concept. Referring to FIG. 3, a semiconductor device 100 according to an exemplary embodiment of the inventive concept includes a cell array 110, a row decoder 120, an address buffer 130, a column decoder 140, a bit line sense amplifier 150, a DQ buffer 160, a command decoder 170, and sense amplifier control logic 180. The sense amplifier control logic 180 generates a pulse for controlling a timing in applying the BSG level according to PVT (Process, Voltage, and/or Temperature) variations.

The cell array 110 includes a plurality of memory cells that are arranged in a row direction and a column direction to be connected to word lines and bit lines. Each memory cell is formed of a cell capacitor and an access transistor. A gate of the access transistor is connected to one of the word lines arranged in the row direction. One end of the access transistor is connected to a bit line BL or a complementary bit line BLB arranged in the column direction. The other end of the access transistor is connected to the cell capacitor.

The row decoder 120 selects a word line of a memory cell to be accessed in response to an input address ADD. The row decoder 120 decodes the input address ADD to enable a word line corresponding to the input address. In a self-refresh operation mode, the row decoder 120 decodes a row address generated from an address counter (not shown) to enable a word line corresponding to the row address. The column decoder 140 selects a bit line of a memory cell which data is to be input or output in or from.

The address buffer 130 temporarily stores an address input from an external device. The address buffer 130 provides the stored address to the row decoder 120 or the column decoder 140. The address buffer 130 converts an address from an external signaling manner to an internal signaling manner of the semiconductor memory device 100. For example, the address buffer may convert the voltage level of the address received to an internal voltage level of the semiconductor memory device.

The bit line sense amplifier 150 writes data to a selected memory cell using a selected bit line or senses data of the selected memory cell using the selected bit line. The bit line sense amplifier 150 senses and outputs data stored in a memory cell through a bit line. The bit line sense amplifier 150 may further comprise components for storing input data in a selected memory cell. Alternatively, the bit line sense amplifier 150 rewrites data stored in a memory cell at a self-refresh mode. The bit line sense amplifier 150 is driven according to control signals LANG and PBSG provided from the sense amplifier control logic 180.

The bit line sense amplifier 150, although not shown, may include an N-type sense amplifier NSA to discharge a low-level bit line of bit lines BL and BLB to the low level and a P-type sense amplifier PSA to charge a high-voltage bit line of the bit lines BL and BLB to the high level. The low level of the N-type sense amplifier NSA corresponds to the BSG level Vbsg higher than the ground level. For example, the bit line sense amplifier 150 includes an NSA driver 155 coupled to at least one of the ground level and the BSG level depending on the control signals LANG and PBSG. The NSA driver 155 may be provided to each column of N-type sense amplifiers NSA or at least two columns of N-type sense amplifiers NSA. When the NSA driver 155 discharges the low-level bit line to the low level, the low-level bit line is discharged toward the ground level Vss at timing t1 of FIG. 2 using the control signal LANG, and then the low-level bit line is maintained at the BSG level Vbsg in response to the control signal PBSG. The timing of applying the BSG level Vbsg to the low-level bit line may depend on PVT variations. The control signals LANG and PBSG will be further described later with reference to FIG. 6.

In the bit line sense amplifier 150 of the inventive concept, the timing of applying the BSG level Vbsg to a low-level bit line is controlled by the control signals LANG and PBSG depending on PVT variations.

The DQ buffer 160 temporarily stores write data provided from an external device and sends it to the sense amplifier 150. The DQ buffer 160 outputs read data transferred from the bit line sense amplifier 150 to the external device.

The command decoder 170 determines an input command based on externally applied signals /CS, /RAS, /CAS, and /WE. An active command and an auto refresh command are generated according to a combination of the signals /CS, /RAS, /CAS, and /WE. A self-refresh command is generated by a combination of the auto refresh command and a clock enable signal CKE. The command decoder 170 decodes the active command and a pre-charge command and provides an active signal ACT or a pre-charge signal PRCH to the sense amplifier control logic 180.

The sense amplifier control logic 180 provides a control signal for applying the BSG level to a low-level bit line according to a command. The sense amplifier control logic 180 controls the bit line sense amplifier 150 in response to the active signal ACT or the pre-charge signal PRCH. For example, the sense amplifier control logic 180 may include a bit line sense amplifier replica. The bit line sense amplifier replica may a similar structure to the bit line sense amplifier 150. The bit line sense amplifier replica will be further described later with reference to FIG. 8. The sense amplifier control logic 180 generates the control signals LANG and PBSG for controlling the NSA driver 155 according to PVT variations, using the bit line sense amplifier replica. The bit line sense amplifier replica includes a circuit structure substantially similar to that of the bit line sense amplifier 150, and the bit line sense amplifier replica operates in a substantially similar manner as the bit line sense amplifier 150. For example, the bit line sense amplifier replica includes a low-level bit line replica which is a counterpart low-level bit line of the bit line sense amplifier 150, and the low-level bit line replica is discharged toward the ground level. Depending on PVT variations, the discharging speed of the low-level bit line replica may change. The sense amplifier control logic 180 generates the control signals LANG and PBSG to compensate for PVT variations by monitoring a voltage level of the bit line voltage replica.

With the semiconductor memory device 100, although PVT variations exist, a BSG level Vbsg is stably provided at a proper timing. Thus, the reliability and yield of the semiconductor memory device 100 is increased.

Figure 4:
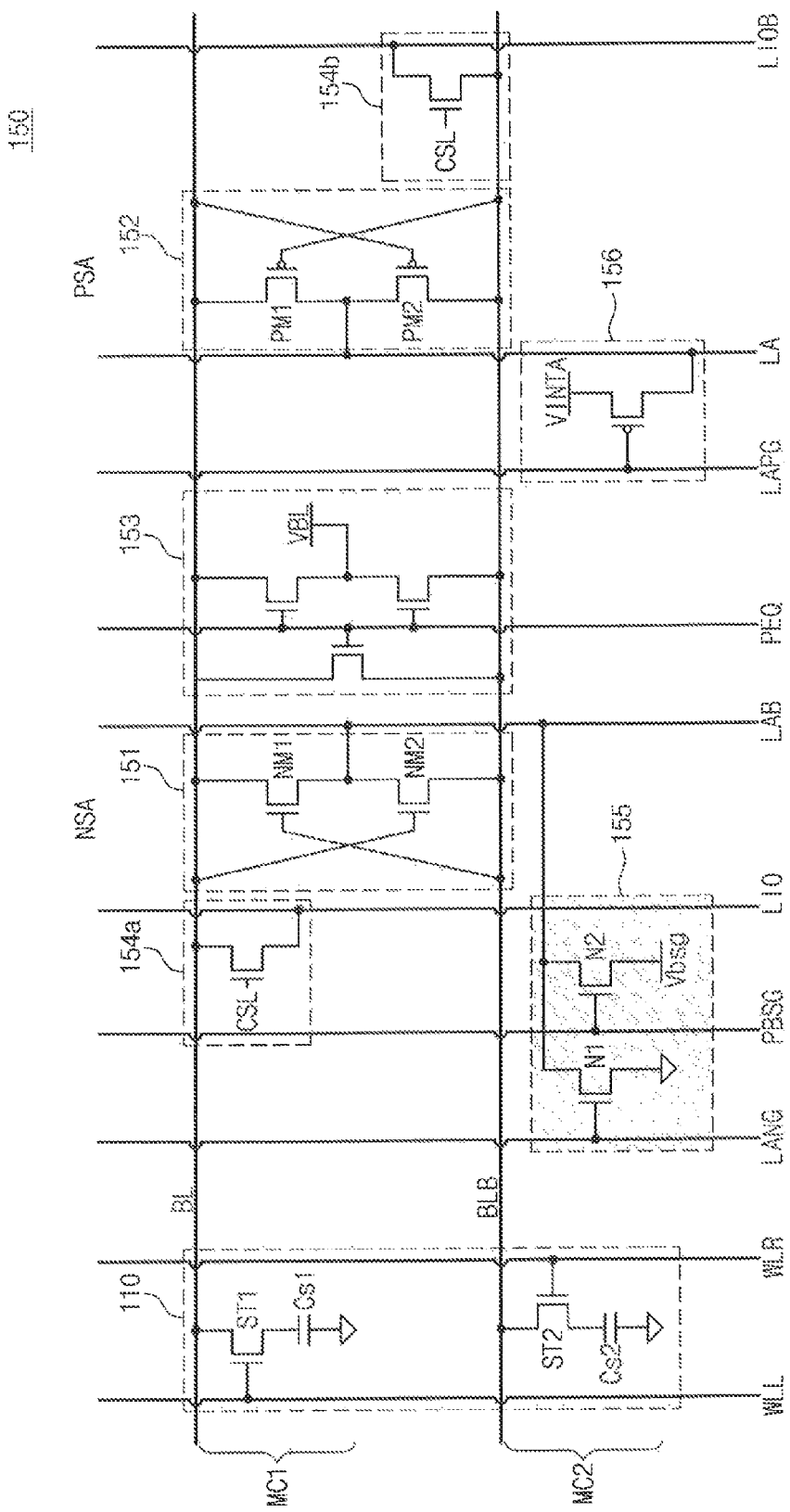
FIG. 4 is a circuit diagram illustrating a bit line sense amplifier according to an exemplary embodiment of the inventive concept.

FIG. 4 is a circuit diagram illustrating a bit line sense amplifier according to an exemplary embodiment of the inventive concept. Referring to FIG. 4, the bit line sense amplifier 150 is connected to bit lines BL and BLB of memory cells MC1 and MC2 included in a cell array 110. The bit line sense amplifier 150 includes an N-type sense amplifier 151, a P-type sense amplifier 152, a pre-charge circuit 153, column select switches 154a and 154b, an NSA driver 155, and a PSA driver 156.

The N-type sense amplifier 151 discharges a low-level bit line of the bit lines BL and BLB to a low level during a sensing operation. The N-type sense amplifier 151 includes two NMOS (N-type Metal Oxide Semiconductor) transistors NM1 and NM2. A gate of the NMOS transistor NM1 is connected to the bit line BLB, and a drain of the NMOS transistor NM1 is connected to the bit line BL, and a source of the NMOS transistor NM1 is connected to a sense enable lien LAB. The NMOS transistor NM2 has a gate connected to the bit line BL, a drain connected to the bit line BLB, and a source connected to the sense enable lien LAB.

The N-type sense amplifier 151 connects a low-level bit line to the sense enable line LAB. The sense enable line LAB is connected to the ground voltage Vss or the BSG level Vbsg depending on the control signals LANG and PBSG. The low-level bit line is one of the bit lines BL and BLB according to data stored in a selected memory cell MC1 or MC2. An operation is described under assumption that data stored in a memory cell MC1 storing logic state "1" is sensed. First, the bit lines BL and BLB are pre-charged and equalized to the pre-charge voltage VDD/2 by a pre-charge circuit 153.

An access transistor ST1 is turned on when a word line WLL is activated to select the memory cell MC1. At this time, charges stored in a cell capacitor Cs1 are shared with the bit line BL. A voltage of the bit line BL is higher than the pre-charge voltage VDD/2 by the charge sharing, and the bit line BLB maintains the half voltage VDD/2. The NSA driver 155 provides a BSG level Vbsg to the bit line BLB through the sense enable line LAB and the NMOS transistor NM2 whose gate is connected to the bit line BL with a voltage increased by the charge sharing. On the other hand, the transistor NM1 gradually closes a current path between the sense enable line LAB and the bit line BL as the voltage level of the bit line BLB goes to the low level. The gate of the transistor NM1 is connected to the bit line BLB, and is coupled to the BSG level Vbsg.

The N-type sense amplifier 151 is coupled to at least one of the ground level Vss and the BSG level Vbsg. The BSG level Vbsg provided to a low-level bit line during a sensing operation may be subject to bit line disturbance such as undershoot or overshoot when the bit lines BL and BLB are connected to data input/output lines LIO and LIOB in a read operation. Such disturbance on the low-level bit line may be quickly eliminated by supplying the BSG level to the low-level bit line. The N-type sense amplifier 151 of the inventive concept is provided with a stable BSG level Vbsg from the NSA driver 155 when PVT variations occur.

The P-type sense amplifier 152 charges a high-voltage bit line of the bit lines BL and BLB with a VDD level at a sensing operation. The P-type sense amplifier 152 includes tow PMOS (P-type Metal Oxide Semiconductor) transistors PM1 and PM2. The PMOS transistor PM1 has a gate connected to the bit line BLB, a source connected to the bit line BL, and a drain connected to a sense enable line LA. The PMOS transistor PM2 has a gate connected to the bit line BL, a source connected to the bit line BLB, and a drain connected to the sense enable line LA.

The P-type sense amplifier 152 charges a high-voltage bit line of the bit lines BL and BLB with a power supply voltage VDD provided to the sense enable line LA.

In response to the voltage difference between the bit lines BL and BLB, the N-type sense amplifier 151 and the P-type sense amplifier 152 cooperate to charge the bit line BL to a high level of a charge voltage VINTA (=VDD) and discharge the bit line BLB to a low level of the BSG level Vbsg. As the bit line BL charges toward the high level of the charge voltage VINTA, the driving capability of the transistor NM2 increases and the driving capability of the transistor PM2 decreases. As the bit line BLB discharges toward the ground level Vss, the driving capability of the transistor NM1 decreases and the driving capability of the transistor PM1 increases. The ground level Vss coupled to the N-type sense amplifier 151 is switched to the BSG level Vbsg at a proper timing after the access transistor ST1 is turned on. The NSA driver 155 provides at least one of the ground level Vss and the BSG level Vbsg to the sense enable line LAB according to control signals LANG and PBSG. The charge voltage VINTA is provided to the sense enable line LA from the PSA driver 156. Such proper time of switching the ground level Vss to the BSG level Vbsg will be described later with reference to FIG. 6. At a sensing operation, the pre-charge circuit 153 pre-charges the bit lines BL and BLB with a half voltage VDD/2 in response to a control signal PEQ. When the control signal PEQ is activated, the pre-charge circuit 153 supplies a bit line pre-charge voltage VBL to the bit lines BL and BLB. The bit line pre-charge voltage VBL may be a half voltage VDD/2. The bit lines BL and BLB are connected such that their voltages are equalized. If the bit lines BL and BLB are charged by the pre-charge level VBL, the control signal PEQ is inactivated.

The column select switches 154a and 154b connect data sensed by the N-type and P-type sense amplifiers 151 and 152 to input/output lines LIO and LIOB in response to a column select signal CSL. The column select switches 154a and 154b are turned on such that the sensed data is transferred to the input/output lines LIO and LIOB. Voltages of the bit lines BL and BLB are varied when charges of bit lines BL and BLB are shared with the input/output lines LIO and LIOB. In exemplary embodiments, a boosted sense ground voltage Vbsg is controlled according to a pulse width of the column select signal CSL, the size of ground transistor N1, a level of bit line disturbance, etc.

The NSA driver 155 provides a driving signal to the sense enable line LAB of the N-type sense amplifier 151. The NSA driver 155 receives control signals LANG and PBSG from sense amplifier control logic 180 (refer to FIG. 3). Based on the control signals LANG and PBSG, the NSA driver 155 grounds the sense enable line LAB or supplies the boosted sense ground voltage Vbsg to the sense enable line LAB.

The NSA driver 155 includes the ground transistor N1 and a boosting transistor N2 to control a voltage of the sense enable line LAB. The ground transistor N1 discharges the sense enable line LAB in response to the control signal LANG. The boosting transistor N2 maintains the sense enable line LAB with the BSG level Vbsg in response to the control signal PBSG. Here, the NSA driver 155 may be disposed over the bit line sense amplifier 150 in a vertical, cross-sectional structure of the semiconductor memory device 100.

The PSA driver 156 provides the charge voltage VINTA (=VDD) to the sense enable line LA of the P-type sense amplifier 152. The PSA driver 156 is controlled by the control signal LAPG from the sense amplifier control logic 180. The control signals LAPG and LANG are complementary to each other.

The bit line sense amplifier 150 provides the BSG level to unselected memory cells by controlling control signal PBSG according to PVT variations. For a pre-charge operation, the low-level bit line is discharged to the ground level Vss by deactivating the control signal PBSG, thereby preventing the bit lines BL and BLB from having an equalized voltage higher than a half voltage VDD/2.

Figure 5:
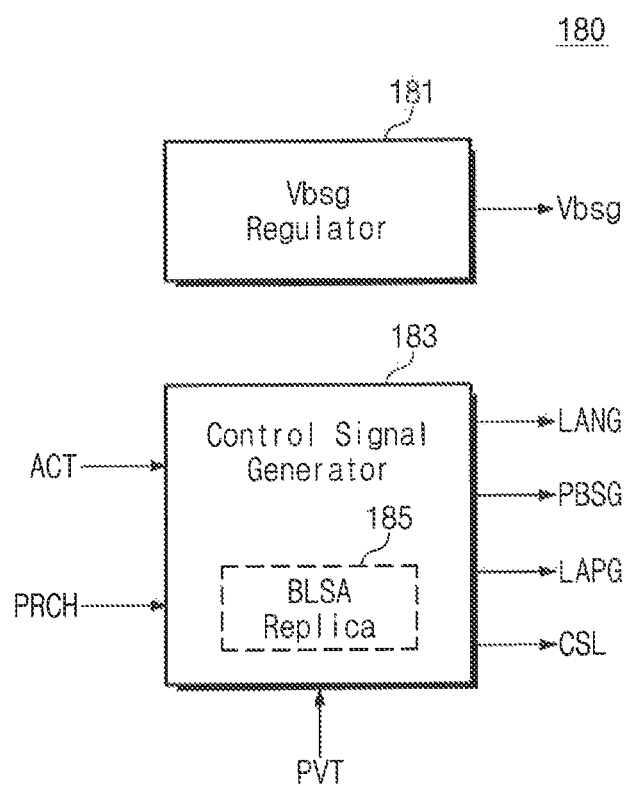
FIG. 5 is a block diagram illustrating a sense amplifier control logic 180 of FIG. 3, according to an exemplary embodiment of the inventive concept.

FIG. 5 is a block diagram illustrating the sense amplifier control logic 180 of FIG. 3, according to an exemplary embodiment of the inventive concept. Referring to FIG. 5, the sense amplifier control logic 180 includes a voltage regulator 181 and a control signal generator 183. The control signal generator 183 includes a bit line sense amplifier replica 185.

The voltage regulator 181 provides a BSG level Vbsg to an NSA driver 155. The voltage regulator 181 generates the BSG level Vbsg higher than a ground level Vss. For example the BSG level Vbsg is about 0.2V higher than the ground level (e.g., 0V). However, the BSG level Vbsg may be various according to a characteristic of the semiconductor memory device 100.

The control signal generator 183 generates control signals LANG and PBSG having pulse signals in response to a command (e.g., an active command or a pre-charge command). The control signal generator 183 generates the control signal LANG to discharge a low-level bit line toward a ground level (e.g., Vss). For example, the control signal generator 183 controls the pulse width of the control signal LANG in consideration of an operation condition (e.g., PVT variations). For the time corresponding to the pulse width of the control signal, the low-level bit line is discharged to the ground level through the sense enable line LAB. The control signal PBSG is generated based on the control signal LANG. The control signal generator 183 generates a control signal LAPG for controlling a PSA driver 156 and a column select signal CSL. A method of generating the signals LAPG and CSL will be further described later with reference to FIG. 6.

The control signal generator 183 includes a bit line sense amplifier replica 185 to generate a control signal LANG in consideration of an operation condition (e.g., PVT variations). The bit line sense amplifier replica 185 is configured to replicate an operation of a bit line sense amplifier 150 described above. The bit line sense amplifier replica 185 may include bit lines, N-type sense amplifiers, P-type sense amplifiers, pre-charge circuits, etc. If an active signal ACT is received, the bit line sense amplifier replica 185 may perform pre-charging and sensing operations on a bit line replica in a substantially similar manner as the bit line sense amplifier 150 does according to a memory access process. At this time, the control signal generator 183 detects a predetermined voltage of the bit line replica of the bit line sense amplifier replica 185. The control signal generator 183 decides a pulse width of a control signal LANG based on the voltage level of the bit line replica. This will be further described with reference to FIG. 7.

Figure 6:
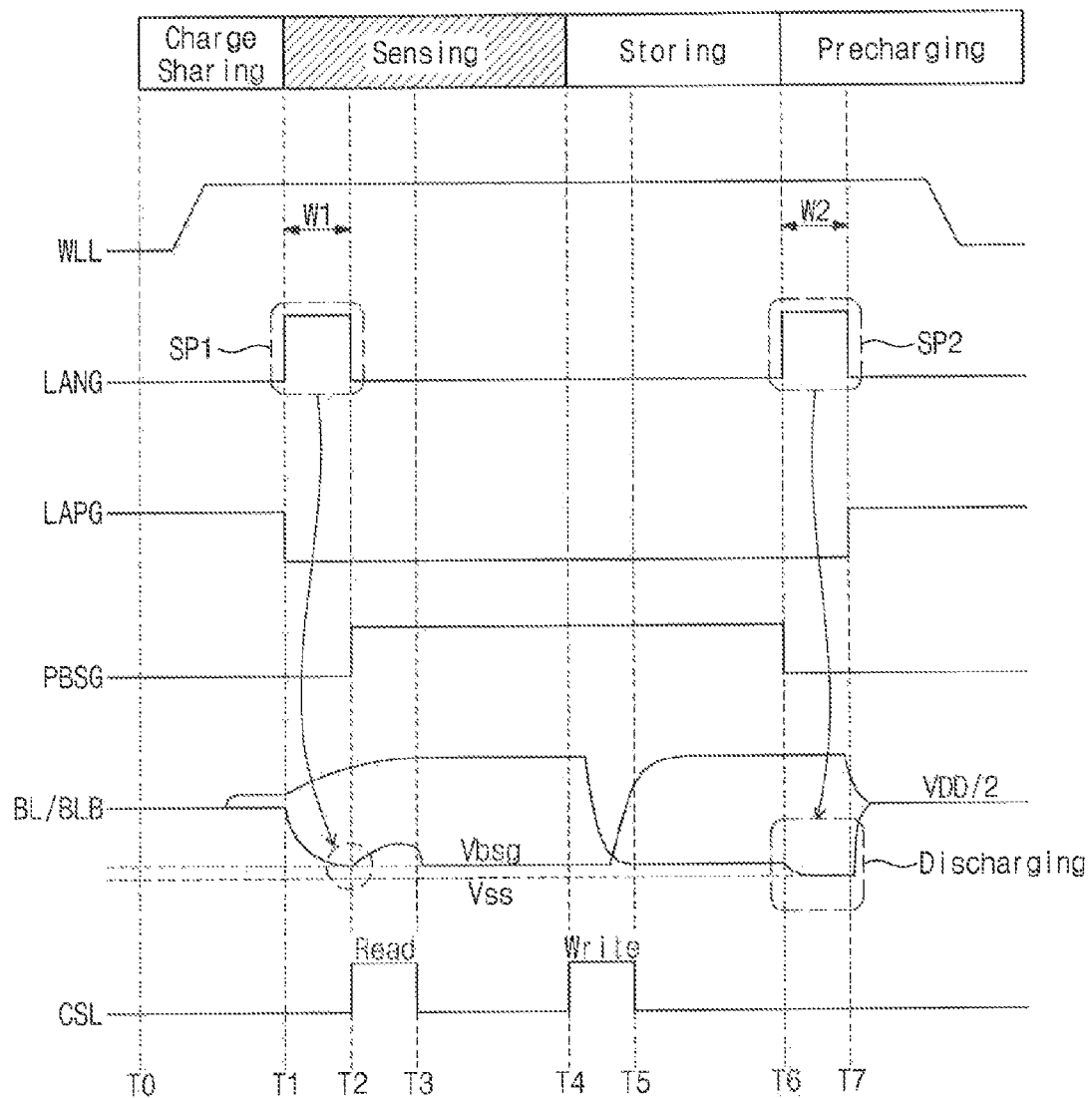
FIG. 6 is a timing diagram illustrating an operation of a control signal generator of FIG. 5, according to an exemplary embodiment of the inventive concept.

FIG. 6 is a timing diagram illustrating an operation of a control signal generator of FIG. 5, according to an exemplary embodiment of the inventive concept. Referring to FIG. 6, the control signal generator 183 generates a control signal LANG based on an output signal of a bit line sense amplifier replica 185. A short pulse corresponding to an active time of the control signal LANG is decided by the output signal of the bit line sense amplifier replica 185. Through this configuration, a low-level bit line voltage is quickly and stably controlled according to an operation condition (e.g., PVT variations). It is possible to stably provide a BSG level Vbsg to a low-level bit line when charges are shared between a bit line and a data input/output in response to a column select signal CSL. If an active signal ACT or a pre-charge signal PRCH is received, selected bit lines are pre-charged with a pre-charge voltage VDD/2.

At T0, a word line WLL is activated to access a selected memory cell (e.g., MC1 of FIG. 4). The word line WLL is selected by the row decoder 120 of FIG. 3.

Referring back to FIG. 4, the access transistor ST1 of the memory cell MC1 is turned on when the word line WLL is activated. At this time, charges in a cell capacitor Cs1 of the memory cell MC1 are shared with charges of the bit line BL. If data corresponding to logic state "1" is stored in the memory cell MC1, a voltage of the bit line BL increases by the charge sharing. During an interval between T0 and T1, a control signal LANG maintains a low level and a control signal LAPG maintains a high level. Thus, a low-level bit line maintains a pre-charge voltage VDD/2.

At T1, the control signal generator 183 of FIG. 5 provides the control signal LANG having a first pulse SP1. Here, the first pulse SP1 has a pulse width W1. The control signal LAPG is activated to a low level. The control signal generator 183 determines a pulse width W1 of the first pulse SP1 based on a low-level bit line replica voltage of the bit line sense amplifier replica 185 of FIG. 5. The low-level bit line replica voltage of the bit line sense amplifier replica 185 is varied according to PVT variations. For example, a discharge speed, a pre-charge speed, a voltage level, etc, of the low-level bit line replica are varied according to PVT variations, for example.

The control signal LANG for controlling a low level of the low-level bit line BL of the sense amplifier 150 is generated by sensing a voltage variation of the low-level bit line replica in the bit line sense amplifier replica 185. For example, the control signal generator 183 is configured to generate the control signal LANG having a first pulse SP1, whose width corresponds to a discharge time for which the low level bit line is discharged toward a ground level. When the low-level bit line replica voltage reaches a BSG level Vbsg, the low-level bit line BL is set to the BSG level Vbsg in a high speed.

At T2, the first pulse SP1 ends. A control signal PBSG is activated at the same time when the first pulse SP1 ends. The BSG level Vbsg is supplied to the low-level bit line BL through the N-type sense amplifier 151 while the control signal PBSG is activated. At this time, the BSG level Vbsg generated by the voltage regulator 181 of FIG. 5 is provided to the N-type sense amplifier 151. The low-level bit line BL is stably set to the BSG level Vbsg.

The column select signal CSL is activated for data output between T2 and T3, regardless of when the first pulse SP1 ends. The column select signal CSL is activated at any time if voltage difference of the bit lines BL and BLB is enough to detect output data. At this time, pre-charged input/output lines LIO and LIOB are connected to the bit lines BL and BLB, and a charge sharing occurs between the pre-charged input/output lines LIO and LIOB, and the bit lines BL and BLB. For example, charges of the pre-charged input/output line LIO flow into the bit line BL that is set to the BSG level Vbsg. In this case, the bit line BL may be subject to overshoot or undershoot due to the charge sharing of the pre-charged input/output lines LIO and LIOB and the bit lines BL and BLB.

Since the low-level bit line BL is coupled to the voltage regulator 181 for generating BSG level Vbsg, the disturbance of the low-level bit line BL is quickly removed and thus the low-level bit line voltage is quickly recovered to the BSG level Vbsg such that such disturbance of overshoot or undershoot does not reduce a sensing margin of the bit line sense amplifier 150. The low-level bit line BL is coupled to the voltage regulator 181 that generates a voltage having the BSG level Vbsg, and thus the noise is quickly removed from the low-level bit line BL. Thus, according to a control method of the inventive concept, high data integrity on read data is secured.

Between T4 and T5, a write command is applied to the same bank activated by the active signal ACT of the read command. According to the write command, a column select signal CSL is activated and input data is transferred to bit lines BL and BLB from data input/output lines LIO and LIOB. At this time, the high-level bite line is discharged toward a low level, and the low-level bit line is charged toward a high level. In this case, the low level is maintained to the BSG level Vbsg. Input data is stored in a selected memory cell by the N-type and P-type sense amplifiers 151 and 152.

At T6, the pre-charge signal PRCH is activated according to a pre-charge command. A pre-charge operation on bit lines is performed. The low-level bit line is discharged to a ground level Vss such that bit lines developed to different voltage levels are pre-charged to a pre-charge voltage VDD/2. In the event that the low-level bit line maintains the BSG level Vbsg and then is pre-charged, the bit lines are pre-charged with a voltage higher than the pre-charge voltage VDD/2.

The control signal generator 183 provides the control signal LANG having a second pulse SP2 in response to the pre-charge signal PRCH. The low-level bit line is discharged to a ground level during an interval corresponding to a pulse width W2 of the second pulse SP2. The control signal generator 183 decides the pulse width W2 of the second pulse SP2 based on a variation in a voltage of a low-level bit line provided by the bit line sense amplifier replica 185.

At T7, selected bit lines are pre-charged to the pre-charge voltage VDD/2. If the low-level bit line is not discharged to the ground level, the bit lines are pre-charged to a voltage higher than the pre-charge voltage VDD/2. An excessive increase in a pre-charge voltage causes an erroneous access operation.

Waveforms of pulses SP1 and PS2 output from the control signal generator 183 of the inventive concept are described. With the pulses SP1 and SP2 of the control signal LANG according to the inventive concept, the reliability and speed on sensing and pre-charging operations of the semiconductor memory device 100 are increased.

Figure 7:
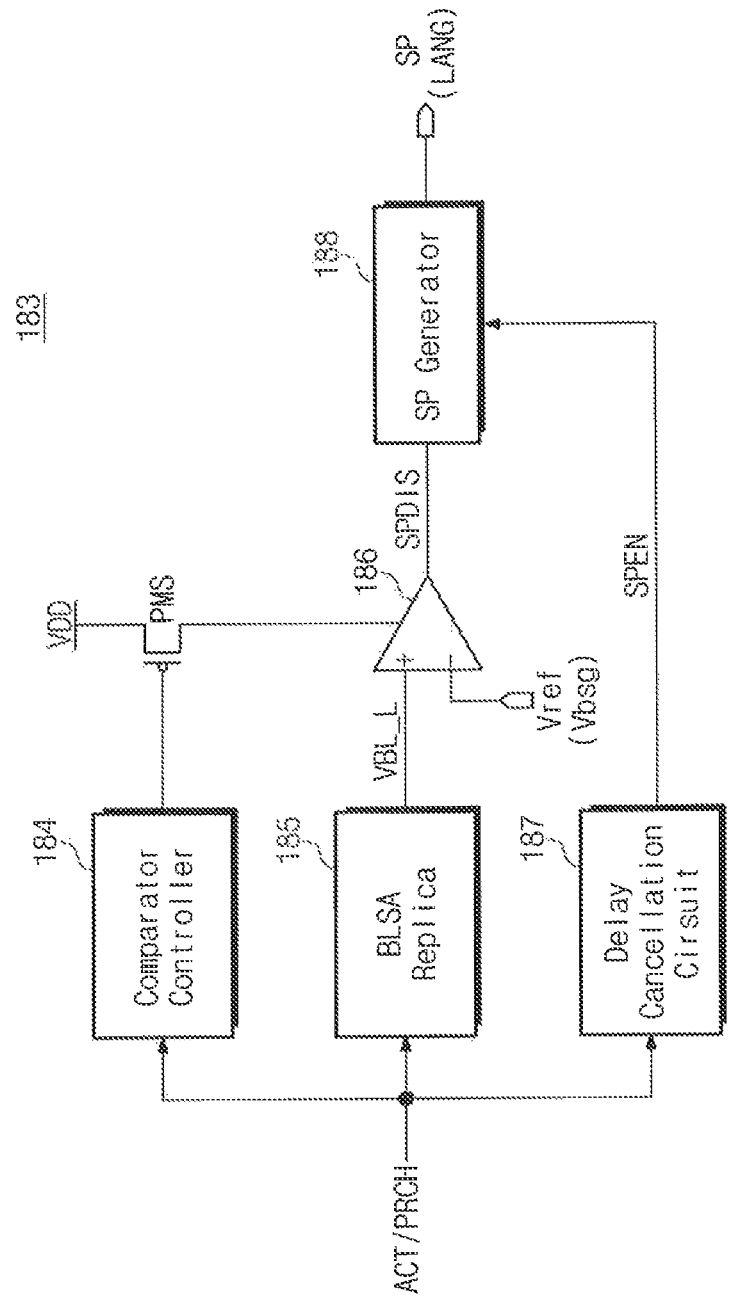
FIG. 7 is a block diagram illustrating a control signal generator of FIG. 5, according to an exemplary embodiment of the inventive concept.

FIG. 7 is a block diagram illustrating the control signal generator 183 of FIG. 5, according to an exemplary embodiment of the inventive concept. Referring to FIG. 7, the control signal generator 183 includes a comparator controller 184, a bit line sense amplifier replica 185, a comparator 186, a delay cancellation circuit 187, and a short pulse generator 188. The control signal generator 183 compares a voltage VBL_L of a low-level bit line replica of the bit line sense amplifier replica 185 with a predetermined reference voltage Vref. The control signal generator 183 decides a pulse width of a first pulse SP1 or a second pulse SP2 of a control signal LANG based on the comparison result. A detailed description is as follows.

The comparator controller 184 activates an operation of the comparator 186 in response to an active signal ACT. If the active signal ACT is provided, the comparator controller 184 turns on a PMOS switch PMS to provide a power supply voltage VDD to the comparator 186. For example, in response to the active signal ACT, the comparator controller 184 switches a gate voltage of the PMOS switch PMS from a high level to a low level.

In response to the active signal ACT, the bit line sense amplifier replica 185 generates a voltage VBL_L of a low-level bit line replica that varies at a sensing operation. The bit line sense amplifier replica 185, in particular, generates the voltage VBL_L of a low-level bit line replica while memory cells are sensed in response to the active signal ACT. For example, the bit line sense amplifier replica 185 and the bit line sense amplifier 150 simultaneously operate in response to the active signal ACT. The bit line sense amplifier replica 185 generates the low-level bit line replica voltage VBL_L in synchronization with the bit line sense amplifier 150. The bit line sense amplifier replica 185 may include simplified memory cells, N-type sense amplifiers, P-type sense amplifiers, pre-charge circuits, etc.

The comparator 186 operates when the active signal ACT is activated. The comparator 186 is supplied with a power supply voltage VDD according to a control of the comparator controller 184. A non-inverting input terminal of the comparator 186 is connected to receive the low-level bit line replica voltage VBL_L of the bit line sense amplifier replica 185, and an inverting input terminal of the comparator 186 is connected to receive the reference voltage Vref. Here, the reference voltage Vref, for example, may be the BSG level Vbsg. The comparator 186 activates a pulse disable signal SPDIS when the low-level bit line replica voltage VBL_L is higher than the BSG level Vbsg. The comparator 186 inactivates the pulse disable signal SPDIS when the low-level bit line replica voltage VBL_L is lower than the BSG level Vbsg.

The delay cancellation circuit 187 generates a pulse enable signal SPEN to activate a pulse of the control signal LANG after the active signal ACT is activated. For example, the delay cancellation circuit 187 controls the short pulse generator 188 to generate a pulse at a time delay TD after the active signal ACT is received. The delay cancellation circuit 187 delays the active signal ACT, activated during an active mode, by the delay time TD to generate the pulse enable signal SPEN. The pulse enable signal SPEN is transferred to the short pulse generator 188. Here, the time delay TD is adjusted by controlling the size of delay tap to make a sensing start time T1 (refer to FIG. 1) and a start time of a short pulse SP be consistent with one another.

The short pulse generator 188 generates a short pulse SP based on the pulse disable signal SPDIS and the pulse enable signal SPEN. The short pulse SP corresponds to a time for which the low-level bit line of an N-type sense amplifier 151 in FIG. 4 is discharged toward a ground level. The low-level bit line is discharged while the short pulse SP is provided. Then, the low-level bit line is supplied with BSG level Vbsg. The short pulse generator 188 is formed of a combinational logic circuit that is configured to generate the short pulse SP at a time when both the pulse disable signal SPDIS and the pulse enable signal SPEN are at a high level. For example, the short pulse generator 188 includes an AND logic receiving the pulse disable signal SPDIS and the pulse enable signal SPEN.

A configuration and an operation of the control signal generator 183 is described hereinafter. The control signal generator 183 generates a control signal LANG having a pulse width that is defined by a time when an active signal ACT is input and a time when a low-level bit line replica voltage VBL_L becomes lower than a reference voltage Vref. Here, a variation in the voltage VBL_L of a low-level bit line is generated through a bit line sense amplifier replica 185. Through this configuration, a variation in the voltage VBL_L of a low-level bit line includes information about noise due to PVT variations. Thus, a discharging time of the N-type sense amplifier 151 in the bit line sense amplifier 150 is determined based on a voltage variation of a low-level bit line replica.

Figure 8:
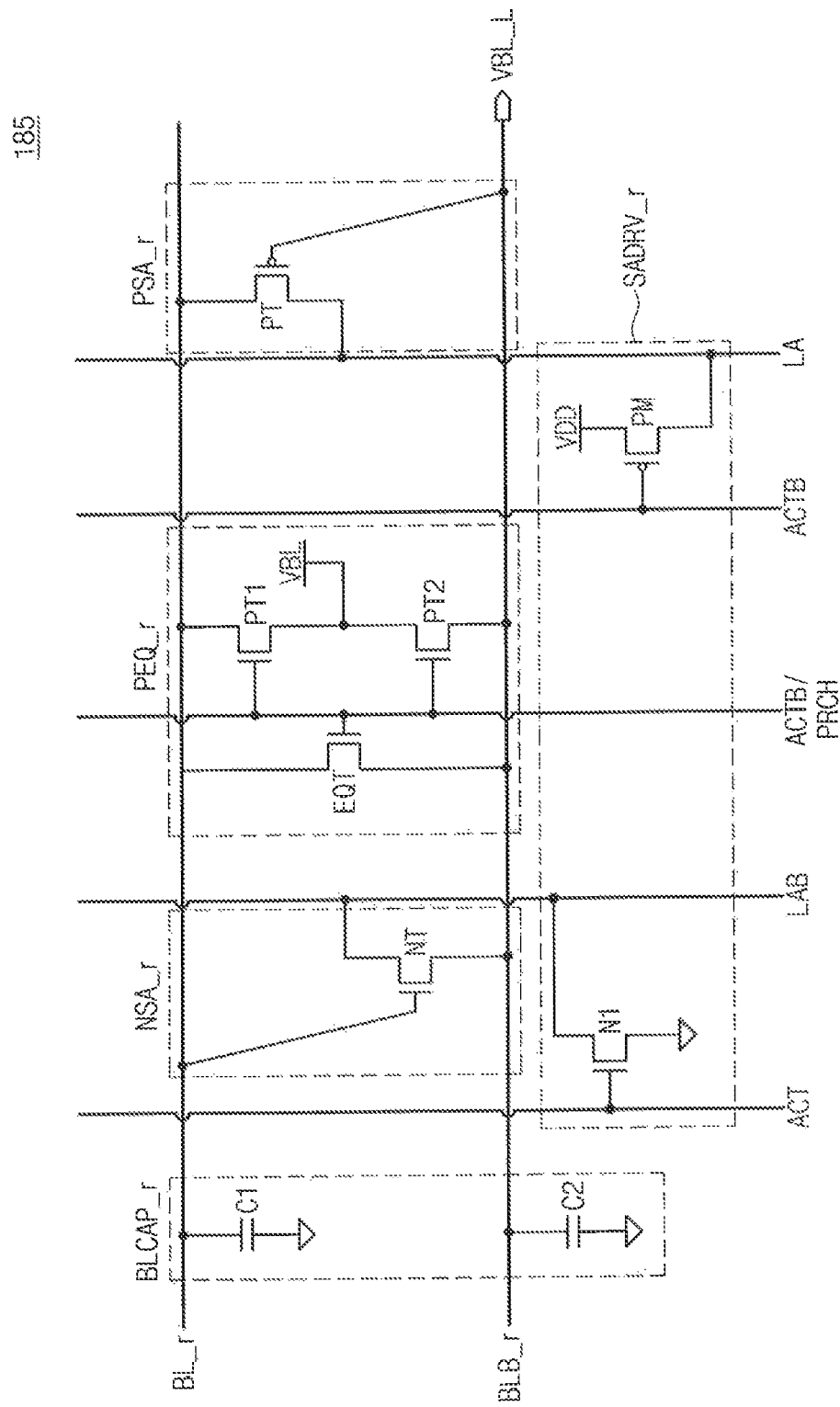
FIG. 8 is a circuit diagram illustrating a bit line sense amplifier replica of FIG. 7, according to an exemplary embodiment of the inventive concept.

FIG. 8 is a circuit diagram illustrating a bit line sense amplifier replica of FIG. 7, according to an exemplary embodiment of the inventive concept. Referring to FIG. 8, a bit line sense amplifier replica 185 includes a bit line capacitor BLCAP_r, an N-type sense amplifier NSA_r, a P-type sense amplifier PSA_r, a pre-charge circuit PEQ_r, and a sense amplifier driver SADRV_r. The bit line sense amplifier replica 185 outputs a bit line voltage in response to an active signal ACT. The bit line sense amplifier replica 185 is configured to discharge a low-level bit line replica to a ground level in response to the active signal ACT. The discharging speed of the low-level bit line replica depends on PVT variations. The bit line replica BLB_R corresponds to the low-level bit line replica discharged to the ground level.

The bit line capacitor BLCAP_r includes capacitors C1 and C2 corresponding to parasitic capacitance of each bit line. Parasitic capacitance of bit line replica connected to the bit line sense amplifier replica 185 BL_r and BLB_r is different from that of counterpart bit lines BL and BLB of the bit line sense amplifier 150. Thus, the capacitors C1 and C2 compensate for such parasitic difference such that the bit line replica BL_r and BLB_r may have substantially the same voltage characteristic as the bit lines BL and BLB. The bit line capacitor BLCAP_r may have capacitance for implementing a voltage variation ratio generated at pre-charging and sensing operations at the bit lines BL and BLB of the bit line sense amplifier 150. The voltage variation ratio of a bit line is variable according to capacitance of the capacitors C1 and C2. The capacitance of the capacitors C1 and C2 may be appropriately trimmed based on parasitic capacitance of the bit line connected to the bit line sense amplifier 150. Each of the capacitors C1 and C2 is formed of at least one MOS transistor with capacitor connection. Alternatively, each of the capacitors C1 and C2 may be formed of a cell capacitor constituting a memory cell.

The N-type sense amplifier NSA_r includes a transistor NT only. The transistor NT has a gate connected to a bit line BL_r, one end connected to a bit line BLB_r, and the other end connected to a sense enable signal (LAB) line. The N-type sense amplifier NSA_r is not connected to a memory cell whose charge is shared with at least one of bit line replica BL_r and BLB_r, so no charge sharing occurs on the bit line replica BL_r and BLB_r. The N-type sense amplifier NSA_r is configured to discharge the bit line BLB_r towards the ground level during a sensing operation.

The P-type sense amplifier PSA_r includes a transistor PT only. The transistor PT has a gate connected to the bit line BLB_r, one end connected to the bit line BL_r, and the other end connected to a sense enable signal (LA) line. The P-type sense amplifier PSA_r charges the bit line BL_r with a power supply voltage VDD during a sensing operation.

The pre-charge circuit PEQ_r pre-charges the bit line replica BL_r and BLB_r in response to an active signal ACTB. Active signals ACT and ACTB are control signals activated or inactivated during a predetermine time according to a decoding result of an active command. When the active signal ACT is at a low level, transistors PT1, PT2 and EQT of the pre-charge circuit PEQ_r are turned on. Thus, the bit lines BL_r and BLB_r are pre-charged with a charge voltage VBL. The charge voltage VBL is an arithmetic average of a ground level Vss and a power supply voltage VDD. For example, the charge voltage VBL corresponds to a half voltage of the power supply voltage VDD. If the active signal ACT transitions to a high level, the transistors PT1, PT2 and EQT of the pre-charge circuit PEQ_r are turned off. Thus, voltages of the bit line replica BL_r and BLB_r are controlled by the N-type and P-type sense amplifiers NSA_r and PSA_r.

The sense amplifier driver SADRV_r provides the ground level Vss and a power supply voltage VDD to the N-type sense amplifier NSA_r and the P-type sense amplifier PSA_r, respectively. The sense amplifier driver SADRV_r includes a transistor N1 for discharging a sense enable line LAB to the ground level Vss. It is unnecessary to apply a BSG level BSG to the sense amplifier replica 185. Thus, the transistor N1 discharges the sense enable signal (LAB) line to the ground level Vss according to the active signal ACT. A transistor PM charges a sense enable line LA with a power supply voltage VDD according to the active signal ACTB.

The sense amplifier replica 185 outputs a low-level bit line replica voltage VBL_L in response to the active signal ACT or ACTB. The low-level bit line replica voltage VBL_L varies from a half of the power supply voltage VDD/2 to a ground voltage Vss by the N-type sense amplifier NSA_r. A variation ratio of a voltage VBL_L of the low-level bit line replica in the sense amplifier replica 185 is variable according to capacitance of capacitors C1 and C2. A component is further included which is configured to set capacitance of capacitors C1 and C2 for matching a variation ratio of the voltage VBL_L of a low-level bit line to be substantially the same as that of a bit line BLB of a bit line sense amplifier 150. The low-level bit line replica voltage VBL_L of the sense amplifier replica 185 is determined according to PVT variations.

Figure 9:
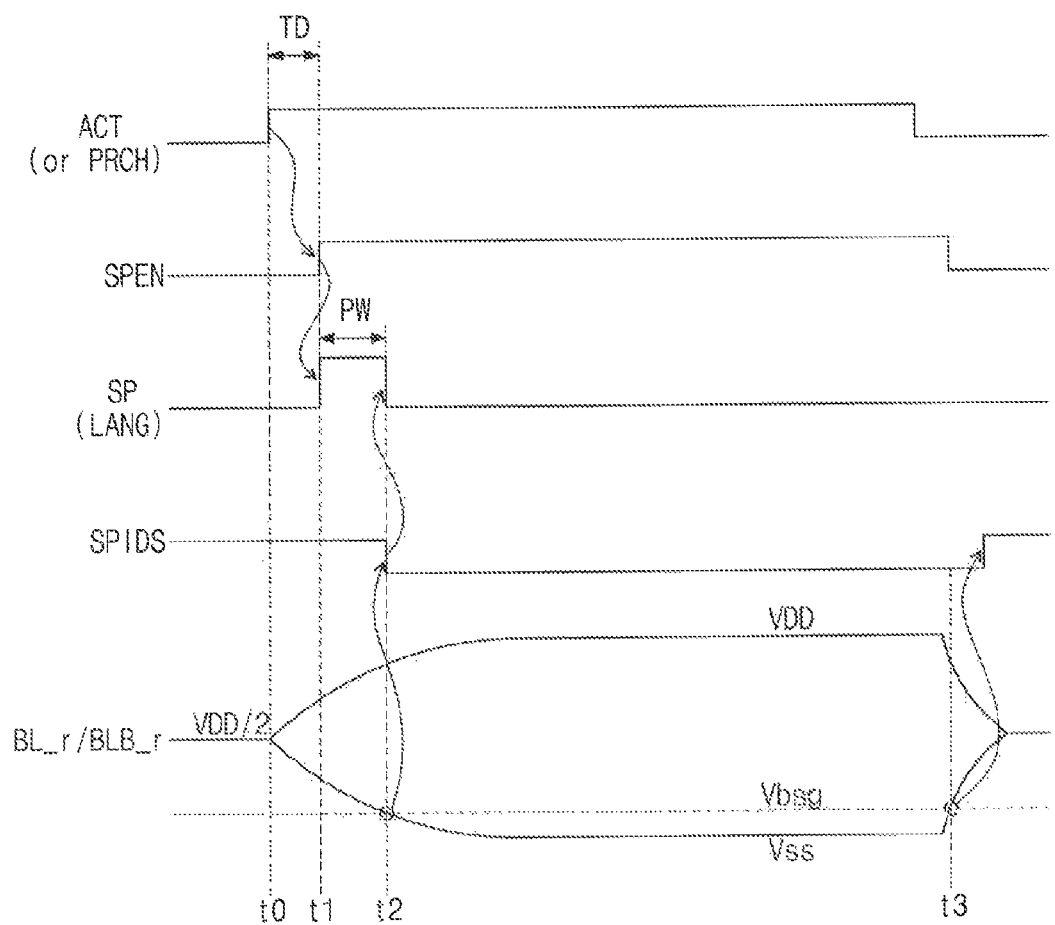
FIG. 9 is a waveform diagram illustrating an internal operation of a control signal generator of FIG. 7, according to an exemplary embodiment of the inventive concept.

FIG. 9 is a waveform diagram showing an internal operation of a control signal generator of FIG. 7. Referring to FIG.

9, the control signal generator 183 decides a pulse width of a control signal LANG based on a low-level bit line replica voltage VBL_L of the bit line sense amplifier replica 185.

The operation of the control signal generator 183 (refer to FIG. 7) is described with reference to FIGS. 8 and 9.

An active signal ACT maintains a low level before an active command is received. All transistors PT1, PT2 and EQT of a pre-charge circuit PEQ_r are turned in response to ACTB having a high level) where the active signal ACT maintains a low level. Thus, bit lines BL_r and BLB_r are charged with a half voltage of the power supply voltage VDD.

Then, when the active command is received, the active signal ACT has a high level at t0. Transistors NM and PM of a sense amplifier driver SADRV_r are turned on in response the active signal ACT. A voltage VBL_L of the bit line BLB_r previously charged with the half voltage of the power supply voltage VDD is discharged toward a ground level. The voltage of the bit line BL_r charged with the half voltage of the power supply voltage VDD starts to increase to the power supply voltage VDD. The bit line sense amplifier replica 185 is not connected to a memory cell configured to store data. Thus, the bit line sense amplifier replica 185 does not have a charge sharing between a cell capacitor and a bit line replica.

A delay cancellation circuit 187 generates a pulse enable signal SPEN after a time TD elapses from t0 when the active signal ACT is activated. The pulse enable signal SPEN transitions to a high level at t1. If a voltage VBL_L of the bit line replica BLB_r is higher than the BSG level Vbsg until t2, a pulse disable signal SPDIS of the comparator 186 maintains a high level. Thus, a short pulse SP transitions to a high level at t1 when the pulse enable signal SPEN transitions to a high level.

At t2, the voltage VBL_L of the bit line BLB_r is lower than the BSG level Vbsg of a reference voltage in the comparator 186. Thus, the pulse disable signal SPDIS transitions to a low level. A short pulse generator 188 generates a short pulse SP having a high-to-low transition at t2, according to the transition of the pulse disable signal SPDIS. Thus, a pulse width PW of the short pulse SP is defined by t1 when the pulse enable signal SPEN transitions to a high level and t2 when the pulse disable signal SPDIS transitions to a low level.

If the active signal ACT transitions to a low level at t3, the transistors PT1, PT2 and EQT of the pre-charge circuit PEQ_r of the bit line sense amplifier replica 185 are turned on. At this time, bit lines BL_r and BLB_r are pre-charged and equalized with a half voltage of the power supply voltage VDD. The pulse disable signal SPDIS of the comparator 186 transitions to a high level from t3 when the voltage VBL_L of the bit line BLB_r is higher than the BSG level Vbsg.

A process of generating a short pulse SP of a control signal LANG is described. However, it is understood that a control signal PBSG for providing a boosted sense ground voltage is generated at rising and falling edges of the short pulse. A voltage VBL_L of a low-level bit line provided from the bit line sense amplifier replica 185 is variable according to a process, a voltage and a temperature although a bias condition is equal to each other. Thus, a pulse width of the short pulse SP generated provides an optimal ground time on an optimal low-level bit line according to this operation condition.

Figure 10:
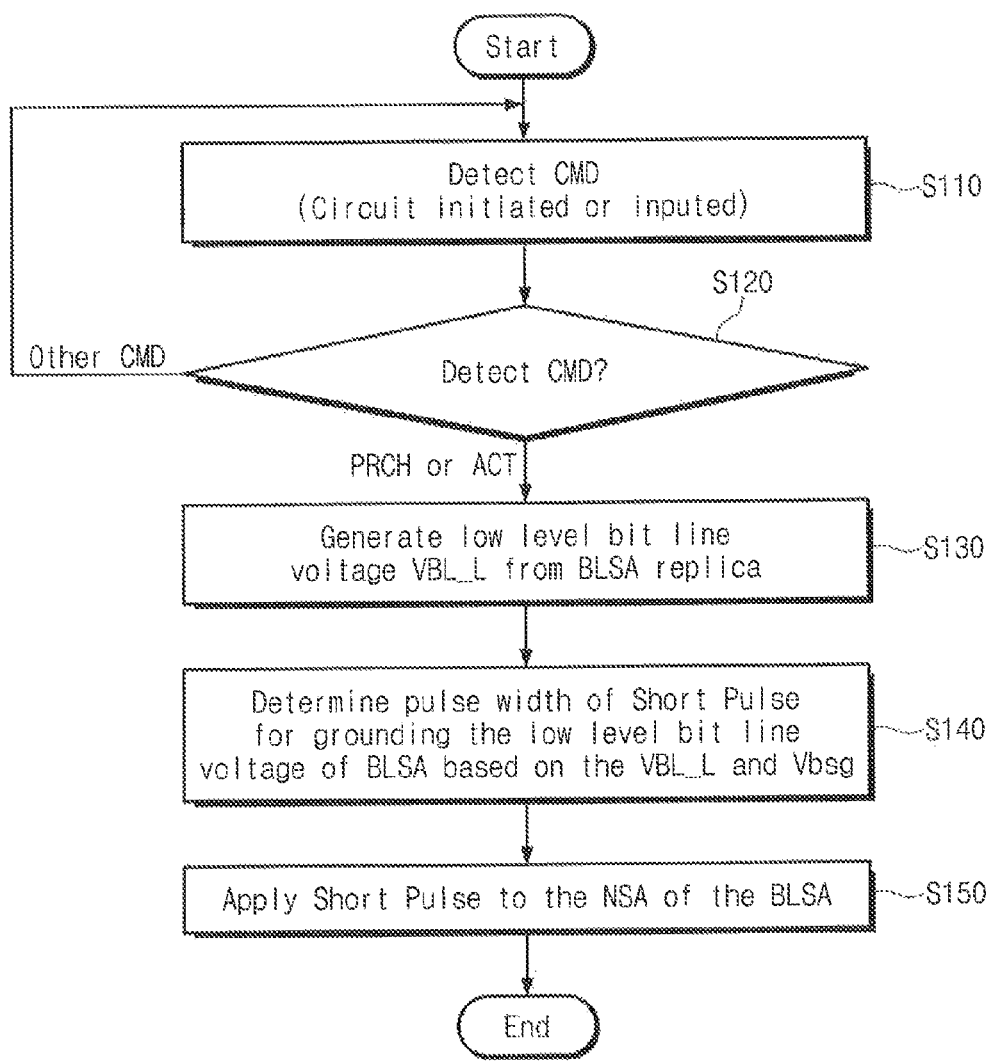
FIG. 10 is a flow chart illustrating a sense amplifier control method of a semiconductor memory device according to an exemplary embodiment of the inventive concept.

FIG. 10 is a flow chart showing a sense amplifier control method of a semiconductor memory device according to an embodiment of the inventive concept. Referring to FIG. 10, the low-level bit line of the bit line sense amplifier 150 in FIG. 4 is discharged to a ground level from a time when an active or pre-charge operation starts. The low-level bit line is discharged for an interval corresponding to a particular pulse width and then is maintained with the BSG level Vbsg or a pre-charge voltage.

In step S110, the sense amplifier control logic 180 detects a command provided from an external device or generated in the semiconductor memory device 100 of FIG. 3.

In step S120, if the sense amplifier control logic 180 detects a command associated with a pre-charge or active operation, the process proceeds to step S130. If the command is not associated with the pre-charge or active operation, the process proceeds to step S110.

In step S130, the bit line sense amplifier replica 185 of FIG. 8 generates a voltage VBL_L of a low-level bit line. The voltage VBL_L of a low-level bit line output from the bit line sense amplifier replica 185 is varied according to PVT variations, for example.

In step S140, a pulse width of a short pulse corresponding to a ground time of the low-level bit line is decided. If the voltage VBL_L of a low-level bit line output from the bit line sense amplifier replica 185 is lower than a boosted sense ground voltage Vbsg, a high interval of the short pulse SP ends.

In step S150, the short pulse is provided as a control signal for discharging the low-level bit line of the bit line sense amplifier 150. For example, the short pulse SP is provided as a control signal LANG for controlling an N-type sense amplifier.

A control method of a semiconductor memory device using a boosted sense ground technique is described. A sensing speed is not decreased by discharging a low-level bit line toward a ground level when a sensing operation starts. Using the bit line sense amplifier replica 185, the BSG level Vbsg is applied at a proper timing.

Figure 11:
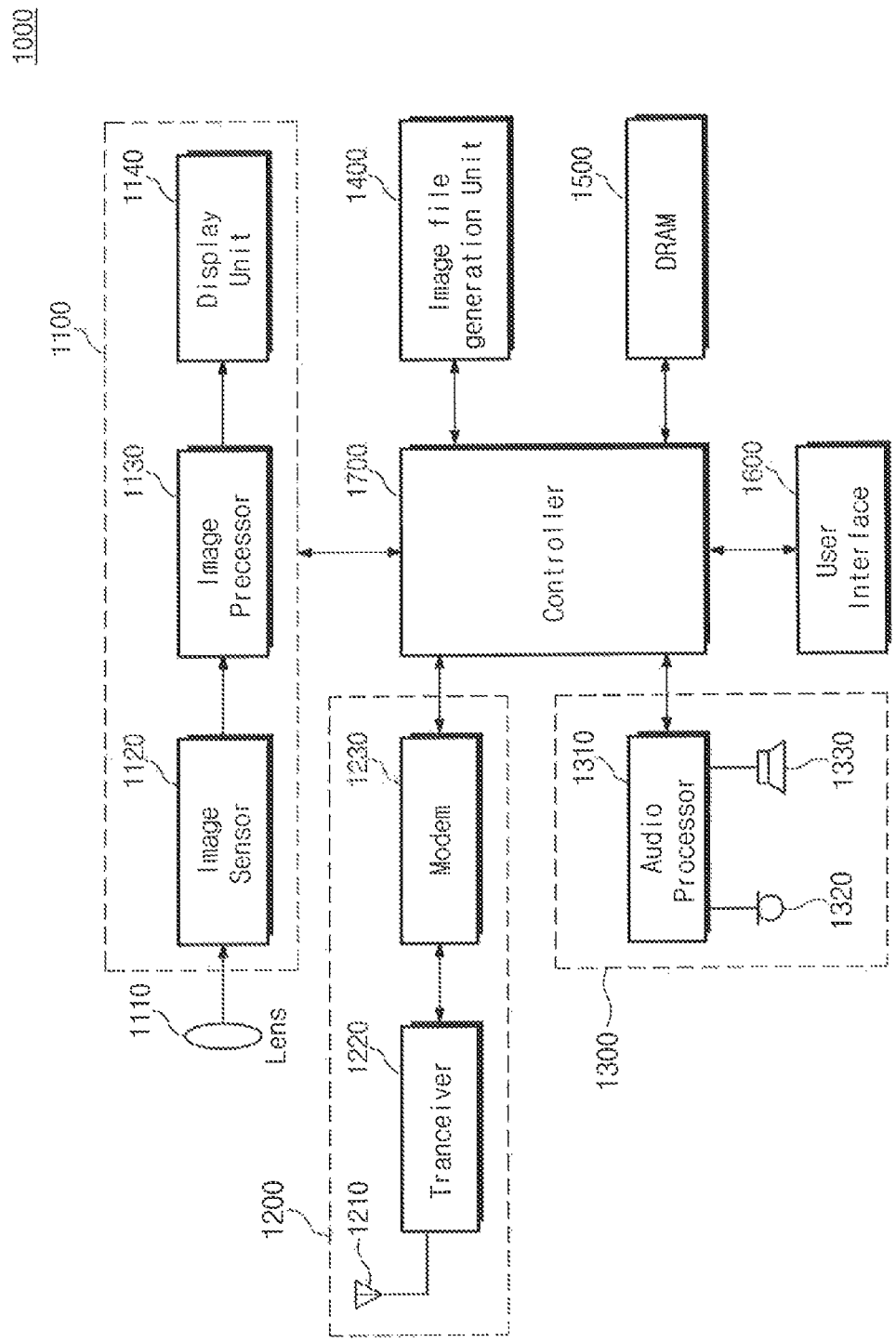
FIG. 11 is a block diagram illustrating an application system including a semiconductor memory device according to an exemplary embodiment of the inventive concept.

FIG. 11 is a block diagram illustrating an application system including a semiconductor memory device according to an exemplary embodiment of the inventive concept. Referring to FIG. 11, an application system 1000 includes an image processing unit 1100, a wireless transceiver unit 1200, an audio processing unit 1300, an image file generating unit 1400, a DRAM 1500, a user interface 1600, and a controller 1700.

The image processing unit 1100 includes an image sensor 1120, an image processor 1130, and a display unit 1140. A lens 1110 is connected to the image processing unit 1100. Alternatively, the image processing unit 1100 may include the lens 1110. The wireless transceiver unit 1200 includes an antenna 1210, a transceiver 1220, and a modem 1230. The audio processing unit 1300 includes an audio processor 1310, a microphone 1320, and a speaker 1330. The image file generating unit 1400 is a component for generating an image file in the application system 1000. The DRAM 1500 is used as a working memory of the application system 1000. The user interface 1600 is a component for being supplied with a user input signal.

Here, the DRAM 1500 is a mobile DRAM. A bit line sense amplifier (not shown) of the DRAM 1500 is configured such that a discharging time of a low-level bit line is varied according to PVT variations. Thus, the DRAM 1500 provides high access speed and data reliability.

A semiconductor memory device according to an exemplary embodiment of the inventive concept may be packed by at least one of PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), and Wafer-Level Processed Stack Package (WSP).

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A semiconductor memory device comprising:
    a cell array including a DRAM cell connected to one of a pair of bit lines;
    a bit line sense amplifier coupled to the pair of bit lines and discharging a low-level bit line of the pair of bit lines toward a ground level during an initial period of sensing operation, clamping the low-level bit line to a boosted sense ground voltage in response to a control signal, and pulling up a high-level bit line of the pair of bit lines toward a core supply voltage level; and
    a sense amplifier control logic generating the control signal having a pulse interval,
    wherein the low-level bit line is discharged toward the ground level for the pulse interval and after the pulse interval ends, the low-level bit line is clamped to the boosted sense ground voltage.

2. The semiconductor memory device of claim 1, wherein the pulse interval is determined based on an operation condition of the semiconductor device.

3. The semiconductor memory device of claim 2, wherein the sense amplifier control logic provides the control signal to discharge the low-level bit line during the pulse interval.

4. The semiconductor memory device of claim 2, wherein the sense amplifier control logic comprises:
    a delay cancellation circuit configured to generate a pulse enable signal in response to an active command;
    a bit line sense amplifier replica configured to generate a low-level bit line replica voltage in response to the active command;
    a comparator configured to compare the low-level bit line replica voltage and the boosted sense ground voltage and to generate a pulse disable signal when the low-level bit line replica voltage is substantially equal to or is lower than the boosted sense ground voltage; and
    a pulse generator configured to generate the control signal and to determine a pulse width of the control signal based on the pulse enable signal and the pulse disable signal.

5. The semiconductor memory device of claim 4, wherein the bit line sense amplifier replica comprises a pair of bit line replicas, each bit line replica having a bit line capacitor configured to match parasitic capacitance of its counterpart bit line of the pair of bit lines.

6. The semiconductor memory device of claim 5, wherein capacitance of the bit line capacitance is adjusted to match the parasitic capacitance.

7. The semiconductor memory device of claim 4, wherein the bit line sense amplifier replica comprises a pre-charge circuit for pre-charging the pair of bit line replicas in response to a pre-charge command.

8. The semiconductor memory device of claim 4, wherein the bit line sense amplifier replica comprises: a first sense amplifier configured to charging one of the pair of bit line replicas in response to the active command; and a second sense amplifier configured to discharge other of the pair of bit line replicas in response to the active command, wherein a voltage of the other of the pair of bit line replicas corresponds to the low-level bit line replica voltage.

9. The semiconductor memory device of claim 1, wherein the bit line sense amplifier comprises a sense amplifier driver configured to provide the ground voltage or the boosted sense ground voltage to the low-level bit line in response to the control signal.

10. The semiconductor memory device of claim 9, wherein the sense amplifier driver comprises: a first driver configured to provide the ground voltage to the low-level bit line in response to a first control pulse; and a second driver configured to provide the boosted sense ground voltage to the low-level bit line in response to a second control pulse.

11. The semiconductor memory device of claim 10, wherein the sense amplifier driver is disposed over the bit line sense amplifier.

12. A method of operating a semiconductor memory device, comprising:
    discharging one of a pair of bit lines and one of a pair of bit line replicas to a ground level in response to a command;
    comparing a voltage of the one of the pair of bit line replicas with a boosted sense ground voltage; and
    terminating the discharging of the one of the pair of bit lines when the voltage of the one of the pair of bit line replicas is substantially equal to or is lower than the boosted sense ground voltage.

13. The control method of claim 12, wherein the command comprises an active command.

14. The control method of claim 12, further comprising: after terminating of the discharging, maintaining the one of the pair of bit lines to the boosted sense ground voltage.

15. The control method of claim 14, further comprising: coupling the one of the pair of bit lines having the boosted sense ground voltage to one of a pair of data input/output lines in response to a column select signal.

16. A semiconductor memory device comprising:
    a pair of bit lines including a first bit line and a second bit line;
    a pair of input/output data lines; and
    a bit line sense amplifier discharging, in response to a first control signal, the first bit line toward a low level for a first time interval and maintain, in response to a second control signal, a boosted sense ground voltage for a second time interval and pulling up the second bit line toward a core supply voltage level,
    wherein the first bit line maintained at the boosted sense ground voltage is coupled to at least one of the pair of input/output data lines in response to a column select signal.

17. The semiconductor memory device of claim 16, wherein the bit line sense amplifier comprising a first NMOS transistor and a second NMOS transistor, the first NMOS transistor configured to couple the low level to the bit line sense amplifier in response to the first control signal, the second NMOS transistor configured to couple the boosted sense ground voltage to the bit line sense amplifier in response to the second control signal.

18. The semiconductor memory device of claim 16, further comprising a sense amplifier control logic configured to generate the first control signal and the second control signal in response to an active command, the sense amplifier control logic comprising a bit line sense amplifier replica, the bit line sense amplifier replica including a pair of bit line replicas having a first bit line replica and a second bit line replica, the bit line sense amplifier replica configured to discharge a first bit line replica toward the low level and charge the second bit line replica to the high level in response to the active command.

19. The semiconductor memory device of claim 18, wherein the sense amplifier control logic further comprising: a delay cancellation circuit configured to generate a pulse enable signal in response to the active command; a comparator configured to compare a voltage of the first bit line replica voltage and the boosted sense ground voltage and to generate a pulse disable signal when the voltage of the first bit line replica voltage is substantially equal to or is lower than the boosted sense ground voltage; and a pulse generator configured to generate the first control signal having a pulse based on the pulse enable signal and the pulse disable signal, a width of the pulse corresponding to the first time interval.

20. The semiconductor memory device of claim 16, wherein the first bit line maintained at the boosted sense ground voltage is discharged to the first level in response to a pre-charge command.

* * * * *